(12) United States Patent
Liu et al.

(10) Patent No.: US 6,700,783 B1
(45) Date of Patent: Mar. 2, 2004

(54) THREE-DIMENSIONAL STACKED HEAT SPREADER ASSEMBLY FOR ELECTRONIC PACKAGE AND METHOD FOR ASSEMBLING

(75) Inventors: Chun-Kai Liu, Taipei (TW); Shin-Terng Chiang, Hsinchu (TW)

(73) Assignee: Industrial Technology Research Institute, Hsin Chu (TW)

( * ) Notice: Subject to any disclaimer, the term of this patent is extended or adjusted under 35 U.S.C. 154(b) by 0 days.

(21) Appl. No.: 10/345,861

(22) Filed: Jan. 15, 2003

(51) Int. Cl.[7] .................................................. H05K 7/20
(52) U.S. Cl. .................. 361/704; 361/707; 361/717; 361/718; 361/719; 361/721; 361/784; 361/790; 257/686; 257/706; 257/707
(58) Field of Search ................................ 361/704, 701, 361/721, 784, 790; 257/686, 706, 712, 777; 165/80.2, 80.3, 185

(56) References Cited

U.S. PATENT DOCUMENTS

| | | | | |
|---|---|---|---|---|
| 5,990,549 A | * | 11/1999 | Chiu et al. ................... | 257/706 |
| 6,297,960 B1 | * | 10/2001 | Moden et al. ............... | 361/719 |
| 6,341,067 B1 | * | 1/2002 | Conder ........................ | 361/719 |
| 6,377,461 B1 | * | 4/2002 | Ozmat et al. ............... | 361/704 |
| 6,493,229 B2 | * | 12/2002 | Akram et al. ............... | 361/704 |

* cited by examiner

*Primary Examiner*—Boris Chervinsky
(74) *Attorney, Agent, or Firm*—Tung & Associates

(57) ABSTRACT

A three-dimensional stacked heat spreader assembly is provided which includes an upper heat spreader of generally rectangular shape having a first edge portion extending downwardly; a lower heat spreader of generally rectangular shape having a second edge portion extending upwardly; a cavity formed in-between the upper heat spreader and the lower heat spreader by engaging the first edge portion and the second edge portion together adapted for receiving an electronic device.

17 Claims, 4 Drawing Sheets

THREE-DIMENSIONAL STACKED HEAT SPREADER ASSEMBLY FOR ELECTRONIC PACKAGE AND METHOD FOR ASSEMBLING

FIELD OF THE INVENTION

The present invention generally relates to a heat spreader assembly for an electronic package and a method for assembling the heat spreader. More particularly, relates to a three-dimensional stacked heat spreader assembly for holding an electronic device and a method for fabricating the stacked heat spreader assembly.

BACKGROUND OF THE INVENTION

An important step in the manufacturing of integrated circuits is packaging during which an IC chip is encased in a metal, ceramic or plastic enclosure. A metal package or a ceramic package provides excellent heat dissipation properties, however, they are expensive and labor intensive packaging techniques. For instance, in a ceramic package, the use of two ceramic substrates represents a significant portion of the total cost of fabricating the IC device.

As the production volume for semiconductor devices grew, the development of more cost effective packages becomes increasingly important. One of such cost effective packages developed in recent years is a plastic molded package or sometimes called a plastic quad flat package (PQFP). Although a plastic molded package presents significant fabrication cost advantages, the desirable heat dissipation property that is inherent in a metal or ceramic package is lost. The shortcoming of the poor heat dissipation property in a plastic molded package becomes more severe in the more recently developed IC devices. In modern IC devices, the density of the device has greatly increased. This is because the chip size has become smaller which means that the devices on the chip are being placed closer together. In order to maintain a reasonable service life of an IC device, the operating temperature of the device must be carefully controlled by providing adequate heat dissipation.

Another development in modern IC devices which further demands improved heat dissipation is the increasing use of higher power consumption circuits. For instance, in a conventional 208-pin PQFP device, only 1.0 watt power dissipation is required. The power dissipation, which is closely related to the heat dissipation property becomes more severe in a modern CPU or ASIC chip which requires 2~3 watts power dissipation capability. The heat dissipation property of a conventional plastic molded package therefore must be improved in order to accommodate the more densely packaged and the higher power consumption IC devices.

A heat sink, normally made of a high thermal conductivity material has been used to fulfill the need for improving heat dissipation in plastic molded packages. The heat sink is sometimes called a heat spreader when a surface of the heat sink is unexposed to the ambient, or called a heat slug when a surface of the heat sink is exposed to the ambient. A heat sink is typically made of a material that has a high thermal conductivity such as copper, copper alloys, aluminum, aluminum alloys or any other high thermal conductivity materials. The heat sink ideally should be in good thermal contact to a semiconductor die.

In a thermal analysis conducted on a ball grid array (BGA) package, it is found that contrary to common misconceptions, most of the heat, i.e., as large as 80% of heat generated by the IC die is transferred downwardly onto a printed circuit board (PCB) by conduction. While only a small percentage, i.e., about 20% is dissipated upwardly by convection and radiation. In order to ensure the reliability or long term service of a ball grid array BGA package, an adequate means must be provided to effectively dissipate heat generated by the IC die during operation of the package.

Various methods for dissipating heat from a BGA package have been proposed by others. For instance, in one of the methods, a heat spreader/heat slug is molded into the plastic molding compound on top of the BGA with a partial surface area of the heat spreader/heat slug exposed. The use of a heat spreader/heat slug combination on top of a BGA package turns out to be ineffective. The reason is that since only 20% of heat generated by the IC die dissipates upwardly, the effectiveness of the heat spreader/heat slug in absorbing and dissipating the heat is limited. Others have used a heat sink of fin type installed on top and in intimate contact with an electronic package. The heat sink while capable of dissipating heat from its multiplicity of pin-shaped fins, the amount of heat actually transferred upwardly into the heat sink is limited. This limits the effectiveness of the heat sink.

It is therefore an object of the present invention to provide an electronic package that is equipped with heat spreaders that does not have the drawbacks or shortcomings of the conventional electronic packages.

It is another object of the present invention to provide an electronic package that is equipped with a three-dimensional stacked heat spreader assembly for the efficient cooling of the package.

It is a further object of the present invention to provide an electronic package that is equipped with an upper heat spreader and at least one lower heat spreader stacked together in a three-dimensional assembly.

SUMMARY OF THE INVENTION

In accordance with the present invention, a three-dimensional stacked heat spreader assembly for electronic package and a method for assembling the heat spreader are provided.

In a preferred embodiment, a three-dimensional stacked heat spreader assembly is provided which includes an upper heat spreader of generally rectangular shape having two sides equipped with downwardly extending ridge portions, each of the downwardly extending ridge portions has an inward-facing surface and a. downward-facing surface; a lower heat spreader of generally rectangular shape having two sides equipped with upwardly extending and downwardly extending ridge portions, the upwardly extending ridge portions have an outward-facing surface and an upward-facing surface for engaging the inward-facing surface and the downward-facing surface of the upper heat spreader, respectively., the downwardly extending ridge portions engage a second lower heat spreader that is optionally stacked under the lower heat spreader; and a cavity formed in-between the upper heat spreader and the lower heat spreader adapted for receiving an electronic device.

The three-dimensional stacked heat spreader assembly may further include a heat-conducting material filling a gap formed between the inward-facing surface on the upper heat spreader and the outward-facing surface on the lower heat spreader. The three-dimensional stacked heat spreader assembly may further include a heat conducting material filling a gap between the downward-facing surface on the upper heat spreader and the upward-facing surface on the lower heat spreader. The heat conducting material may be an adhesive or a solder.

The present invention further directs to a three-dimensional electronic package that is encapsulated in stacked heat spreaders which includes an upper heat spreader of generally rectangular shape that has a first edge portion; a lower heat spreader of generally rectangular shape that has a second edge portion for engaging the first edge portion of the upper heat spreader and for forming a cavity therein-between; and an electronic device situated in the cavity between the upper and the lower heat spreaders.

The three-dimensional electronic package encapsulated in stacked heat spreaders may further include a heat-conducting material dispensed in-between the first edge portion and the second edge portion. The heat-conducting material may be an adhesive or a solder. The electronic device may be selected from the group consisting of a ball grid array package, a wire-bonded IC package and a chip scale package. The first edge portion on the upper heat spreader may include a downwardly extending ridge portion that has an inward-facing surface and a downward-facing surface, while the second edge portion on the lower heat spreader may include an outward-facing surface and an upward-facing surface. The lower heat spreader may have a hollow center portion for mounting the electronic device thereover. The three-dimensional electronic package may further include at least a second lower heat spreader that is bonded to a bottom surface of the lower heat spreader forming a second cavity therein-between. adapted for receiving a second electronic device. The electronic device may further include a plurality of solder balls on a bottom surface for establishing electrical communication with a printed circuit board that is positioned under the electronic device.

The present invention further directs to a method for forming a three-dimensional electronic package that is surrounded by stacked heat spreaders including the steps of providing an upper heat spreader of generally rectangular shape that has a first edge portion extending downwardly; providing a lower heat spreader of generally rectangular shape that has a second edge portion extending upwardly; mounting an electronic device on a top surface of the lower heat spreader in such a way that bonding means on the electronic device are exposed through a hollow portion in the lower heat spreader; and sealingly engaging the first edge portion on the upper heat spreader to the second edge portion on the lower heat spreader forming the three-dimensional electronic package.

The method for forming a three-dimensional electronic package may further include the step of sealingly engaging the first edge portion to the second edge portion by using a heat-conducting adhesive or a solder. The method may further include the step of bonding the three-dimensional electronic package to a printed circuit board by bonding means provided on the electronic device. The method may further include the step of selecting the electronic device from the group consisting of a ball grid array package, a wire-bonded IC package and a chip scale package.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATED EMBODIMENTS

The present invention discloses a three-dimensional stacked heat spreader assembly which includes an upper heat spreader, a lower heat spreader and a cavity formed therein-between. The upper heat spreader is generally of rectangular shape that has two sides equipped with downwardly extending ridge portions, each of the downwardly extending ridge portions has an inward-facing surface and a downward-facing surface. The lower heat spreader is generally of rectangular shape that has two sides equipped with upwardly extending and downwardly extending ridge portions, the upwardly extending ridge portions have an outward-facing surface and an upward-facing surface for engaging the inward-facing surface and the downward-facing surface of the upper heat spreader, respectively. The downwardly extending ridge portions further engage a second lower heat spreader that is optionally stacked under the lower heat spreader. The cavity formed in-between the upper heat spreader and the lower heat spreader is adapted for receiving an electronic device such as a BGA package, a wire-bonded package or a chip scale package.

The present invention three-dimensional stacked heat spreader assembly may further include a heat-conducting material that fills a gap formed between the inward-facing surface on the upper heat spreader and the outward-facing surface on the lower heat spreader. The heat-conducting material further fills a gap formed between the downward-facing surface on the upper heat spreader and the upward-facing surface on the lower heat spreader. The heat-conducting material may be an adhesive or a solder.

The invention further discloses a three-dimensional electronic package that is encapsulated in stacked heat spreaders that includes an upper heat spreader, a lower heat spreader and an electronic device situated in a cavity formed between the upper and the lower heat spreader. The upper heat spreader has a first edge portion for engaging a second edge portion on the lower heat spreader forming a cavity therein-between.

The invention further discloses a method for forming a three-dimensional electronic package that is surrounded by stacked heat spreaders including the steps of first providing an upper heat spreader of generally rectangular shape having a first edge portion extending downwardly; then providing a lower heat spreader of generally rectangular shape that has a second edge portion extending upwardly; then mounting an electronic device on a top surface of the lower heat spreader in such a way that bonding means on the electronic device are exposed through a hollow portion in the lower heat spreader; and sealingly engaging the first edge portion on the upper head spreader to the second edge portion on the lower heat spreader forming a three-dimensional electronic package.

Figure 1A:
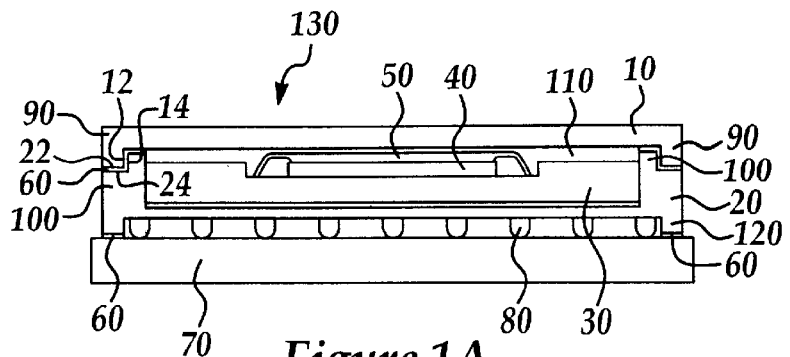
FIG. 1A is an enlarged, cross-sectional view of a present invention three-dimensional stacked heat spreader assembly for a ball grid array package.

Referring initially to FIG. 1A, wherein a present invention three-dimensional electronic package 130 that is encapsulated in stacked heat spreaders, i.e., an upper heat spreader 10 and a lower heat spreader 20 is shown. The present invention electronic package 130 includes an upper heat spreader 10, a lower heat spreader 20, an IC chip 40 mounted on a substrate 30, and bonding means such as solder balls 80 on a bottom surface of the substrate 30. The IC chip 40 is encapsulated by a polymeric molding compound 50.

A heat-conducting material 60 is filled into a gap formed between the polymeric molding material 50 and the upper heat spreader 10. The same heat-conducting material 60 is also used between the inwardly-facing surface 12, the downward-facing surface 22 of the ridge portion 90 and the outwardly-facing surface 14 and the upward-facing surface 24 of the ridge portion 100, respectively, for achieving a seal between the upper heat spreader 10 and the lower heat spreader 20 along two parallel edges 16 and 18 (shown in FIG. 1B). The heat-conducting material 60 is further applied at the interface between the lower heat spreader 20 and the substrate 70. A suitable heat-conducting material may be a heat-conducting adhesive or a solder, depending on the surfaces to be connected together.

Figure 1B:
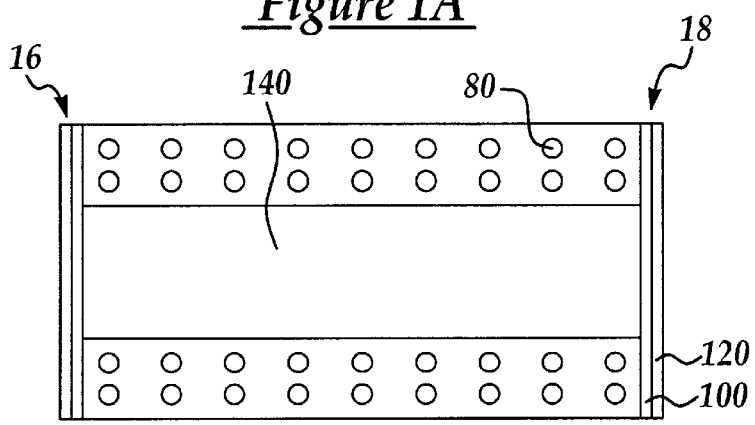
FIG. 1B is an enlarged, bottom view of the present invention three-dimensional stacked heat spreader assembly of FIG. 1A.

FIG. 1B is a bottom view of the lower heat spreader 20 with the substrate 30, the IC chip 40, and the upper heat spreader 10 mounted thereon. FIG. 1B shows a bottom view of the assembly of FIG. 1A without the printed circuit board 70. The upwardly extending ridge portion 100 and the downwardly extending ridge portion 120 are also shown in FIG. 1B. A hollow portion 140 is provided in the lower heat spreader 20 to accommodate the protruding IC chip 40 and the plurality of bonding means 80, i.e., the solder balls. The solder balls 80 are used for establishing electrical communication with the printed circuit board 70 positioned under the lower heat spreader 20.

Figure 1C:
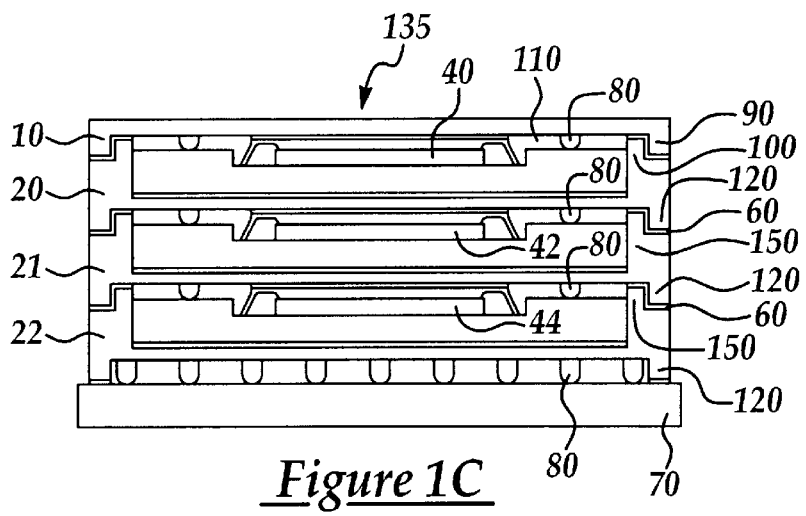
FIG. 1C is an enlarged, cross-sectional view of the present invention three-dimensional stacked heat spreader assembly of FIG. 1A having three lower heat spreaders stacked together.

In an alternate embodiment of the present invention three-dimensional electronic package enclosed in stacked heat spreaders shown in FIG. 1A, a similar arrangement 135 that is equipped with three lower heat spreaders 20, 21 and 22 stacked together is shown in FIG. 1C. The first lower heat spreader 20 is mated to the second lower heat spreader 21 by engaging a downwardly-extending ridge portion 120 of the first lower heat spreader 20 with the upwardly-extending ridge portion 150 of the second lower heat spreader 21. A heat-conducting material 60 is again used in-between the connection to facilitate a seal between the two lower heat spreaders 20, 21. Similarly, the second lower heat spreader 21 is mated to the third lower heat spreader 22 by engaging a downwardly extending ridge portion 120 of the second lower heat spreader 121 to the upwardly extending ridge portion 150 of the third lower heat spreader 22 with the heat-conducting material 60 at the junction of the two members. Electrical communications between the IC chips 40, 42 and 44 are established through the plurality of solder balls 80, and furthermore, with the printed circuit board 70.

In a second preferred embodiment, a three dimensional electronic package 160 formed by wire bonding is provided. The three-dimensional electronic package 160 is formed by an upper heat spreader 170 and a lower heat spreader 180 intimately engaging each other. The structure of the two heat spreaders 170, 180 is similar to those shown in FIG. 1A for the first preferred embodiment. The difference is the wire bonding arrangement between an IC chip and a substrate, instead of a ball grid array package shown in FIG. 1A.

Figure 2A:
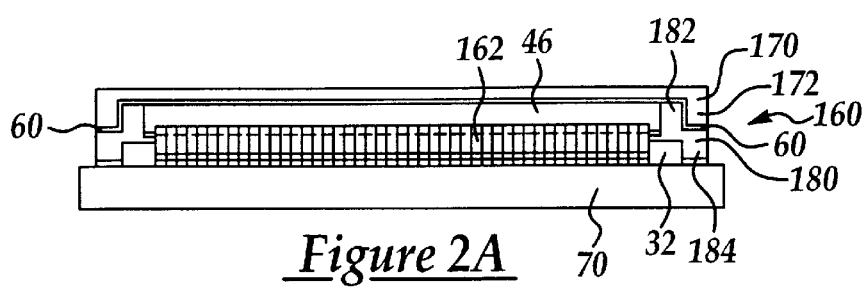
FIG. 2A is an enlarged, cross-sectional view of the present invention three-dimensional stacked heat spreader assembly for a wire-bonded package.
Figure 2B:
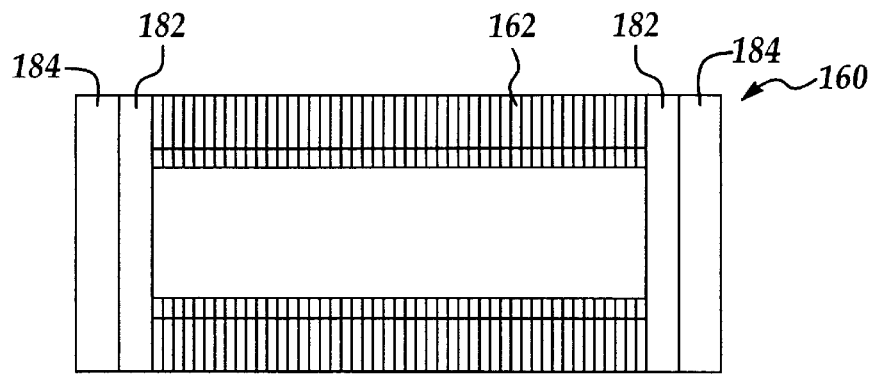
FIG. 2B is an enlarged, bottom view of the three-dimensional stacked heat spreader assembly of FIG. 2A.
Figure 2C:
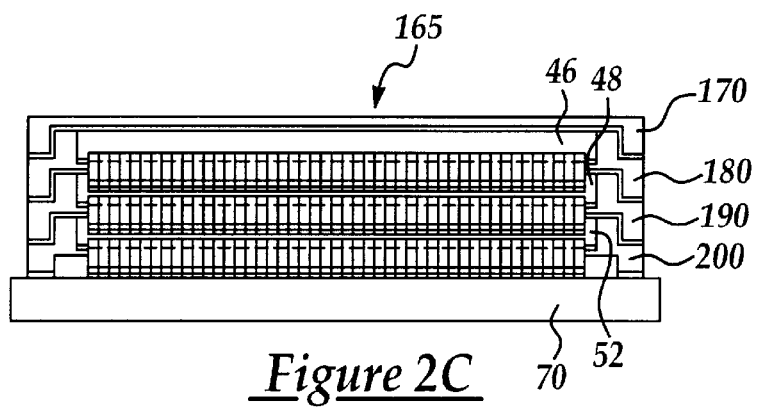
FIG. 2C is an enlarged, cross-sectional view of the present invention three-dimensional stacked heat spreader assembly of FIG. 2A having three lower heat spreaders stacked together.

A bottom view of the lower heat spreader 180 with the wire-bonded IC chip contained therein is shown in FIG. 2B. The upwardly extending ridge portion 182 of the lower heat spreader seals against a downwardly extending ridge portion 172 of the upper heat spreader 170. A heat-conducting material 60, similar to that previously used, is filled between the two ridge portions 182 and 172. Wire bonds 162 are used for establishing electrical communication between the IC chip 46 and the substrate 32. Another embodiment of the present invention second preferred embodiment of an electronic package 165 is shown in FIG. 2C in an enlarged, cross-sectional view. In this alternate embodiment, three lower heat spreaders 180, 190 and 200 are utilized which are stacked together accommodating three wire-bonded IC chips 46, 48 and 52. The stacking arrangement of the three lower heat spreaders 180, 190 and 200 is similar to that shown in FIG. 1C for the BGA packages.

Figure 3A:
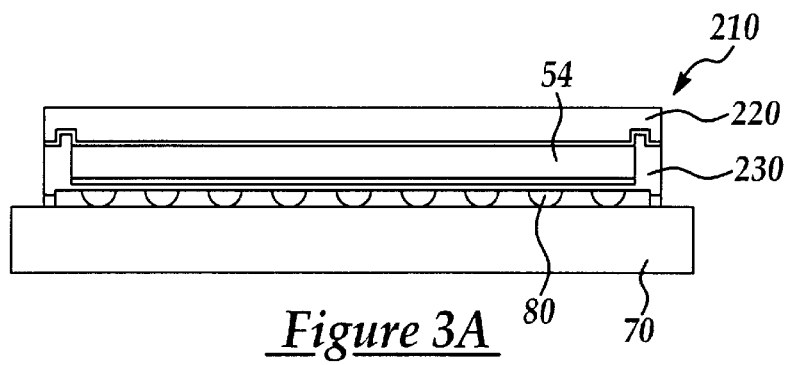
FIG. 3A is an enlarged, cross-sectional view of the present invention three-dimensional stacked heat spreader assembly for a chip scale package.
Figure 3B:
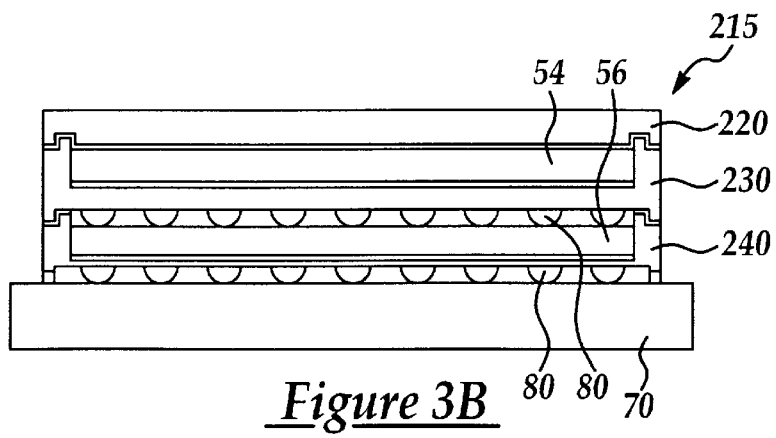
FIG. 3B is an enlarged, cross-sectional view of the three-dimensional stacked heat spreader assembly of FIG. 3A having two lower heat spreaders stacked together.

A present invention third preferred embodiment of an electronic package 210 is shown in FIG. 3A for packaging chip scale packages (CSP). In this arrangement, the electronic package 210 is constructed by stacking an upper heat spreader 220 and a lower heat spreader 230 together with an IC chip 54 therein-between. A plurality of bonding means 80, i.e., solder balls is used to provide electrical communication between the IC chip 54 and the printed circuit board 70. A similarly constructed electronic package 215 with two lower heat spreaders 230, 240 is shown in FIG. 3B for packaging IC chips 54 and 56. A plurality of solder balls 80 is used to establish electrical communication between the two chips 54, 56 and with the printed circuit board 70.

Figure 4A:
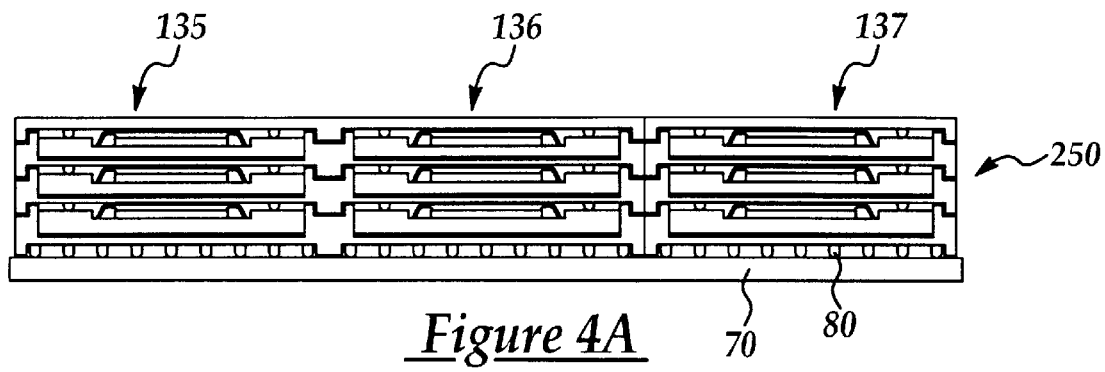
FIG. 4A is an enlarged, cross-sectional view of the preset invention three-dimensional stacked heat spreader assembly for modular BGA packages.
Figure 4B:
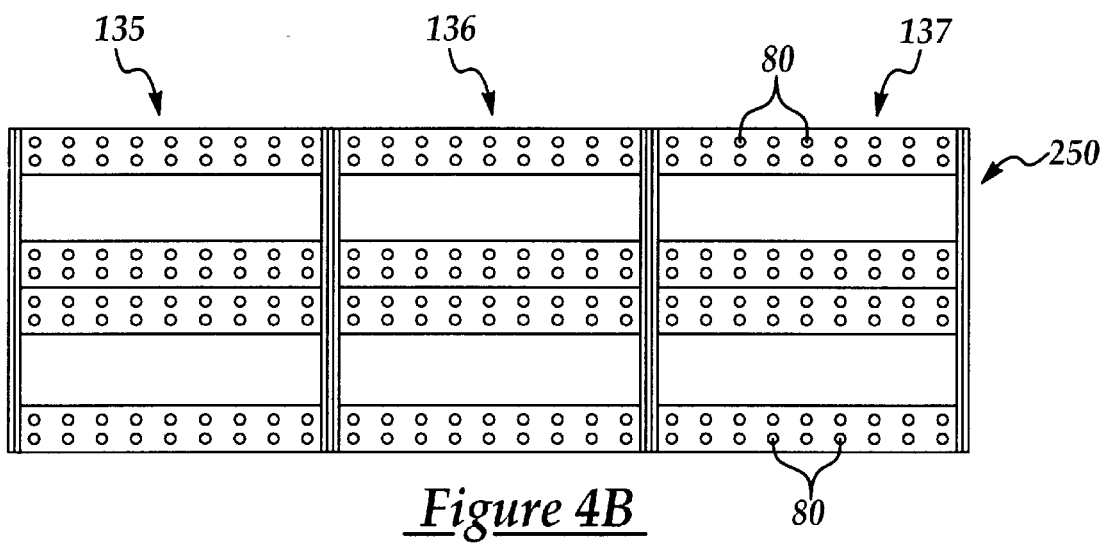
FIG. 4B is an enlarged, bottom view of the three-dimensional stacked heat spreader assembly of FIG. 4A.

The present invention novel method for providing an electronic package in a stacked heat spreader assembly can further be utilized in packaging modular packages of BGA devices. This is shown in FIGS. 4A and 4B. FIG. 4A is an enlarged, cross-sectional view of three-dimensional electronic packages 135, 136 and 137 which is similar to the single BGA package shown in the first preferred embodiment of FIGS. 1A, 1B and 1C. The modular arrangement 250 shown in FIG. 4A is achieved by placing the single BGA package 135 shown in FIG. 1C side-by-side together and thus achieving improved heat dissipation due to the increased planar area. FIG. 4B shows the bottom view of the modular BGA package 250 of FIG. 4A.

Figure 5A:
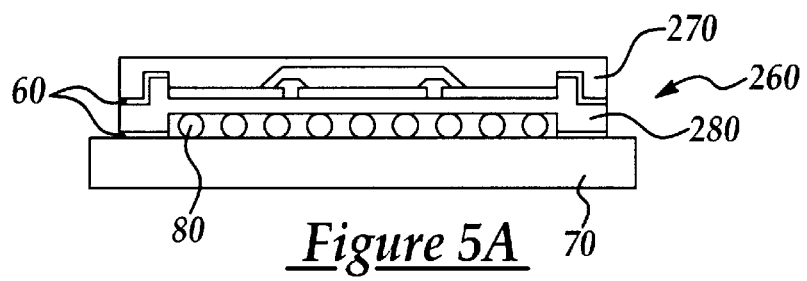
FIG. 5A is an enlarged, cross-sectional view for a hollow-centered substrate with the lower heat spreader contacting a bottom surface of an IC device.
Figure 5B:
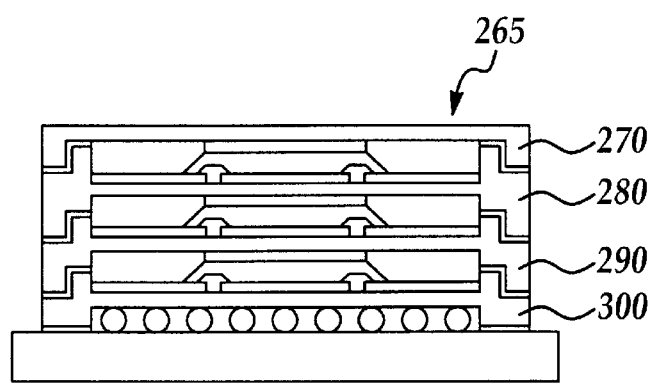
FIG. 5B is the present invention three-dimensional stacked heat spreader assembly of FIG. 5A having three lower heat spreaders stacked together.

A fifth preferred embodiment of the present invention electronic package utilizing the stacked heat spreader arrangement is shown in FIGS. 5A and 5B, wherein the bottom of the substrate is hollowed such that the lower heat spreader contacts directly with the IC device. The electronic package 260 is constructed by an upper heat spreader 270 and a lower heat spreader 280 intimately engaged together with a heat conducting material 60 therein-between. The center portion of the substrate is hollowed out such that the IC device can be bonded directly to the lower heat spreader 280. A similar enlarged, cross-sectional view of an electronic package that is equipped with three lower heat spreaders 280, 290 and 300 is shown in FIG. 5B.

Figure 6A:
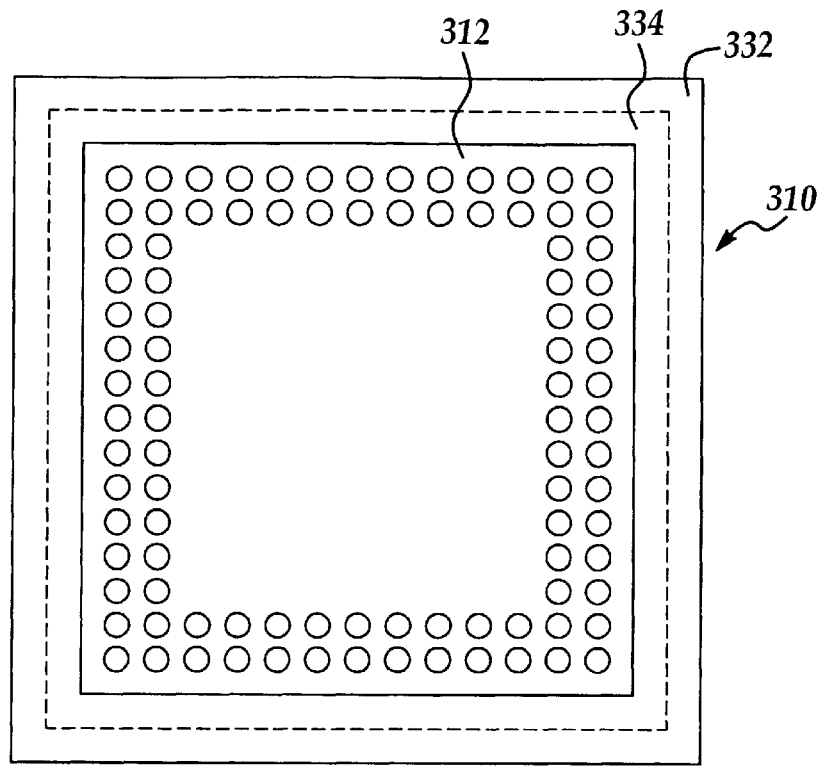
FIG. 6A is an enlarged, bottom view of a present invention three-dimensional stacked heat spreader assembly for a BGA package wherein the edge portions surround the package.
Figure 6B:
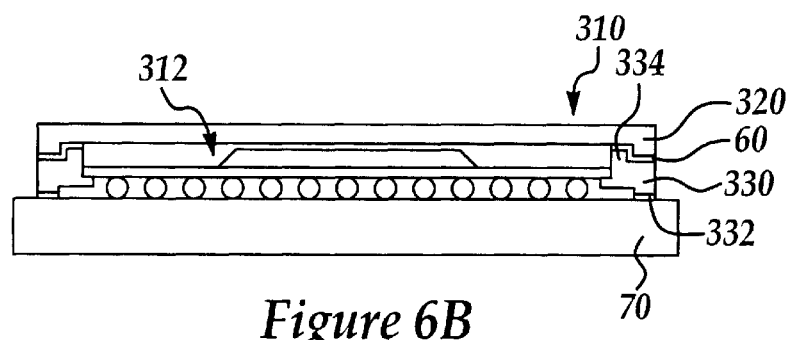
FIG. 6B is an enlarged, cross-sectional view of the present invention three dimensional stacked heat spreader assembly of FIG. 6A.
Figure 6C:
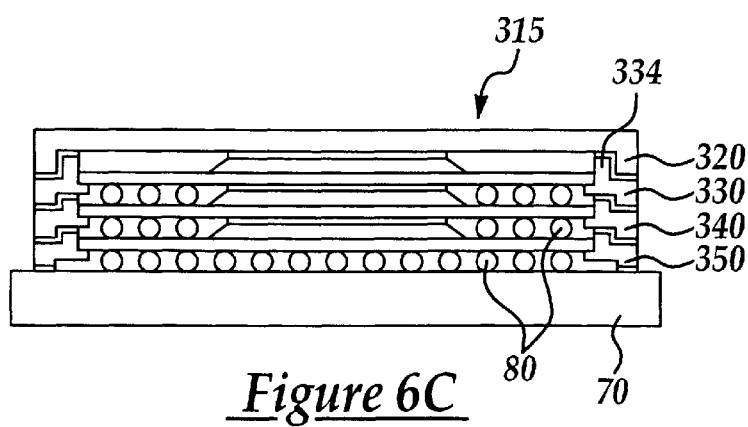
FIG. 6C is an enlarged, cross-sectional view of the three dimensional heat spreader assembly of FIG. 6A having three lower heat spreaders stacked together.

A sixth preferred embodiment of the present invention electronic package utilizing the stacked heat spreader assembly 310 is shown in FIGS. 6A, 6B and 6C. The electronic package 310 is used to package BGA packages with the ridge portions 332, 334 surrounding the BGA package 312. FIG. 6B is an enlarged, cross-sectional view showing the stacked heat spreader constructed by an upper heat spreader 320 and a lower heat spreader 330, while the heat spreader assembly in FIG. 6C is constructed by an upper heat spreader 320 and three lower heat spreaders 330, 340 and 350.

The present invention novel electronic package that utilizes a stacked heat spreader assembly and a method for forming the assembly have therefore been amply described in the above description and in the appended drawings of FIGS. 1A~6C.

While the present invention has been described in an illustrative manner, it should be understood that the terminology used is intended to be in a nature of words of description rather than of limitation.

Furthermore, while the present invention has been described in terms of six preferred embodiments, it is to be appreciated that those skilled in the art will readily apply these teachings to other possible variations of the inventions.

The embodiment of the invention in which an exclusive property or privilege is claimed are defined as follows.

What is claimed is:

1. A three-dimensional stacked heat spreader assembly comprising:
    an upper heat spreader of generally rectangular shape having two sides equipped with downwardly extending ridge portions, each of said downwardly extending ridge portions having an inward-facing surface and a downward-facing surface;
    a lower heat spreader of generally rectangular shape having two sides equipped with upwardly extending and downwardly extending ridge portions, said upwardly extending ridge portions having an outward-facing surface and an upward-facing surface for engaging said inward-facing surface and said downward-facing surface of said upper heat spreader, respectively, said downwardly extending ridge portions for engaging a second lower heat spreader that is optionally stacked under said lower heat spreader; and
    a cavity formed in-between said upper heat spreader and said lower heat spreader adapted for receiving an electronic device.

2. A three-dimensional stacked heat spreader assembly according to claim 1, further comprising a heat-conducting material filling a gap formed between said inward-facing surface on said upper heat spreader and said outward-facing surface on said lower heat spreader.

3. A three-dimensional stacked heat spreader assembly according to claim 1, further comprising a heat-conducting material filling a gap formed between said downward-facing surface on said upper heat spreader and said upward-facing surface on said lower heat spreader.

4. A three-dimensional stacked heat spreader assembly according to claim 2, wherein said heat-conducting material is an adhesive or a solder.

5. A three-dimensional stacked heat spreader assembly according to claim 3, wherein said heat-conducting material is an adhesive or a solder.

6. A three-dimensional electronic package encapsulated in stacked heat spreaders comprising:
    an upper heat spreader of generally rectangular shape having a first edge portion;
    a lower heat spreader of generally rectangular shape having a second edge portion for engaging said first edge portion of said upper heat spreader and for forming a cavity there-in-between, wherein said lower heat spreader having a hollow center portion for mounting an electronic device thereover, and
    said electronic device situated in said cavity between said upper and aid lower heat spreaders.

7. A three-dimensional electronic package encapsulated in stacked heat spreaders according to claim 6, further comprising a heat-conducting material dispensed in-between said first edge portion and said second edge portion.

8. A three-dimensional electronic package encapsulated in stacked heat spreaders according to claim 7, wherein said heat-conducting material is an adhesive or a solder.

9. A three-dimensional electronic package encapsulated in stacked heat spreaders according to claim 6, wherein said electronic device is selected from the group consisting of a ball grid array package, a wire-bonded IC package and a chip scale package.

10. A three-dimensional electronic package encapsulated in stacked heat spreaders according to claim 6, wherein said first edge portion comprises a downwardly extending ridge portion having an inward-facing surface and a downward-facing surface, said second edge portion comprises an outward-facing surface and an upward-facing surface.

11. A three-dimensional electronic package encapsulated in stacked heat spreaders according to claim 6, further comprising at least a second lower heat spreader bonded to a bottom surface of said lower heat spreader forming a second cavity therein-between adapted for receiving a second electronic device.

12. A three-dimensional electronic package encapsulated in stacked heat spreaders according to claim 6 wherein said electronic device further comprises a plurality of solder balls on a bottom surface for establishing electrical communication with a printed circuit board positioned under said electronic device.

13. A method for forming a three-dimensional electronic package surrounded by stacked heat spreaders comprising the steps of:
    providing an upper heat spreader of generally rectangular shape having a first edge portion extending downwardly;
    providing a lower heat spreader of generally rectangular shape having a second edge portion extending upwardly;
    mounting an electronic device on a top surface of said lower heat spreader in such a way that bonding means on said electronic device are exposed through a hollow portion in said lower heat spreader; and sealingly engaging said first edge portion on said upper heat spreader to said second edge portion on said lower heat spreader forming said three-dimensional electronic package.

14. A method for forming a three-dimensional electronic package surrounded by stacked heat spreaders according to claim 13, further comprising the step of sealingly engaging said first edge portion to said second edge portion by using a heat-conducting adhesive or a solder.

15. A method for forming a three-dimensional electronic package surrounded by stacked heat spreaders according to claim 13, further comprising the step of bonding said three-dimensional electronic package to a printed circuit board (PCB) by said bonding means on said electronic device.

16. A method for forming a three-dimensional electronic package surrounded by stacked heat spreaders according to claim 13, further comprising the step of selecting said electronic device from the group consisting of a ball grid array package, a wire-bonded IC package and a chip scale package.

17. A method for forming a three-dimensional electronic package surrounded by stacked heat spreaders according to claim 13, wherein said first edge portion comprises a downwardly extending ridge portion having an inward-facing surface and a downward-facing surface, said second edge portion comprises an outward-facing surface and an upward-facing surface.

* * * * *